United States Patent
Bradley

[11] Patent Number: 6,157,183
[45] Date of Patent: Dec. 5, 2000

[54] TWO PORT HANDHELD VECTOR NETWORK ANALYZER WITH FREQUENCY MONITOR MODE

[75] Inventor: Donald A. Bradley, Morgan Hill, Calif.

[73] Assignee: Anritsu Company, Morgan Hill, Calif.

[21] Appl. No.: 09/447,603

[22] Filed: Nov. 23, 1999

Related U.S. Application Data

[60] Division of application No. 08/865,882, May 30, 1997, Pat. No. 6,020,733, which is a continuation-in-part of application No. 08/362,179, Dec. 22, 1994, Pat. No. 5,642,039.

[51] Int. Cl.$^7$ ................................................ G01R 23/165
[52] U.S. Cl. ................................ 324/76.23; 324/76.13; 324/76.19; 324/76.29
[58] Field of Search ...................... 324/73.1, 76.12, 324/76.13, 76.14, 76.19, 76.23, 76.29, 76.39, 103 P

[56] References Cited

U.S. PATENT DOCUMENTS

| | | | |
|---|---|---|---|
| 3,808,526 | 4/1974 | Jackson | 324/57 |
| 4,001,695 | 1/1977 | Hrbacek et al. | 324/76.23 X |
| 4,510,440 | 4/1985 | Ryder | 324/77 |
| 4,527,116 | 7/1985 | Sorba et al. | 324/77 |
| 4,603,304 | 7/1986 | Burns et al. | 331/2 |
| 4,607,215 | 8/1986 | Takano et al. | 324/76.23 |
| 4,620,147 | 10/1986 | Niki | 324/76.23 |
| 4,626,787 | 12/1986 | Mefford | 328/14 |
| 4,728,884 | 3/1988 | Gumm | 324/76.82 |
| 4,742,566 | 5/1988 | Nordholt et al. | 455/260 |
| 4,868,494 | 9/1989 | Ryder et al. | 324/79 |
| 4,896,102 | 1/1990 | DuBois | 324/76.26 |
| 4,943,787 | 7/1990 | Swapp | 331/2 |
| 5,016,202 | 5/1991 | Seibel et al. | 364/571.07 |
| 5,038,096 | 8/1991 | Obie et al. | 324/76.23 |
| 5,119,035 | 6/1992 | Goy et al. | 324/639 |
| 5,140,703 | 8/1992 | Payne | 455/226.01 |
| 5,210,484 | 5/1993 | Remillard et al. | 324/118 |
| 5,317,284 | 5/1994 | Yang | 331/2 |
| 5,434,888 | 7/1995 | Fukuchi | 375/307 |
| 5,524,281 | 6/1996 | Bradley et al. | 455/67.3 |
| 5,736,845 | 4/1998 | Kosuge | 324/76.27 |

FOREIGN PATENT DOCUMENTS

| | | | |
|---|---|---|---|
| 43 20 181 A1 | 12/1994 | Germany | G01R 23/163 |
| 196 15 651 A1 | 10/1996 | Germany | G01R 23/173 |
| WO 92/08990 | 5/1992 | WIPO | G01R 23/16 |
| WO 96/19735 | 12/1995 | WIPO | G01R 23/16 |

OTHER PUBLICATIONS

Day, C. Design considerations for maximizing the performance/cost ratio in an RF economy network analyzer. *Conference Proceedings RF Expo West* pp. 238–254, Jan. 29–Feb. 1, 1995.

Brandt, Spectrum analyzers:precision test instruments. *Microwave Journal* vol. 37, No. 3 (Mar. 1994) pp. 98–105.

*Primary Examiner*—Glenn W. Brown
*Attorney, Agent, or Firm*—Fliesler Dubb Meyer & Lovejoy LLP

[57] ABSTRACT

A two port handheld VNA enabling both reflection and transmission measurements to be made over a range of 25 MHz to 3.3 GHz frequency range. The handheld VNA includes a tracking synthesizer which generates a LO signal without a direct connection to a reference oscillator, enabling resolution of the LO signal to be independent of a generated RF test signal. Synchronous detectors are further included to provide incident, reflected, and transmitted IF signals to an A/D converter. To enable operation in the presence of external signals, a feedback dither line is provided from one of the synchronous detector outputs to sweep the frequency of the reference oscillator. The handheld VNA also is configured to optionally operate as a frequency monitor to determine the frequency range and power level of incoming signals without upconverting and downconverting to eliminate images as typically done in a spectrum analyzer. The frequency monitoring circuit operates by dividing the frequency range to be monitored into bins. The LO signal is then stepped for each bin until RF signals within the bin frequency range can generate an IF signal. The maximum IF signal power level detected during measurements for the bin is then stored as a power level for signals in each bin.

4 Claims, 6 Drawing Sheets

TWO PORT HANDHELD VECTOR NETWORK ANALYZER WITH FREQUENCY MONITOR MODE

CROSS-REFERENCE TO RELATED APPLICATION

This application is a divisional of application Ser. No. 08/865,882, filed May 30, 1997, now U.S. Pat. No. 6,020,733, which is a continuation-in-part of U.S. patent application Ser. No. 08/362,179 entitled "Handheld Vector Network Analyzer", by Bradley et al., filed Dec. 22, 1994, now U.S. Pat. No. 5,642,039 (hereinafter the cross-referenced handheld VNA application), and claims priority therefrom.

BACKGROUND OF THE INVENTION

1. Field of the Invention

The present invention relates to a vector network analyzer (VNA) with components utilized to limit size, weight and power consumption. More particularly, the present invention relates to components utilized to provide such a VNA with two measurement ports and to enable the VNA to alternatively function to monitor the frequency and power level of a received signal.

2. Description of the Related Art

Wireless networks for telephone or computer local area network (LAN) communications have been adopted worldwide in the 0–3 GHz frequency range. For instance, cellular telephones in the United States operate in the 800 MHz range, pagers operate in the 900 MHz range, and personal communication services (PCS) telephones are allocated operation frequencies in the 1850–2200 MHz range.

Wireless communications networks such as for cellular telephones, pagers, or PCS require remotely located antennas which transmit signals from cell sites to provide services to individual users. To reduce service costs for the remote antennas, it is desirable to test the remote antenna and its associated microwave components at its remote location and locate and repair portions which fail.

VNAs enable a user to easily identify a fault and to measure the distance from the test device to a fault or discontinuity. A fault may result from environmental conditions such as corrosion of a connector, or from faulty installation or repair, for example, where a coaxial cable is punctured by an installer. Test measurements are first typically made using a VNA operating in the frequency domain to determine whether a fault exists as indicated by an undesirable standing wave ratio (SWR). If a fault is discovered, an analysis of the results derived from the frequency domain measurement is made in the time domain to locate the position of the fault.

A VNA also enables calibration to extend the test port connection to the end of a cable connected to the test port. By using a VNA to extend the test port to the end of the cable, errors in the cable will not be taken into account when measuring a device through the cable. Scalar devices which measure only amplitude do not enable extension of the test port to the end of a cable.

Because a remote antenna may be constantly providing signals for communications devices once it is installed, it is desirable that the remote antenna not be disabled for testing. By measuring both phase and amplitude, a VNA provides the ability to distinguish extraneous signals, enabling tests to be performed with the remote antenna active. Scalar devices cannot distinguish the extraneous signals, requiring that scalar tests be performed with the remote antenna disabled.

Most VNAs are large and not easily transportable. Typical VNAs have a housing greater than two feet on a side, and with a power supply may weigh 50 pounds or more. The VNAs are typically transported by truck to the remote antenna sight and carried by two people to the remote antenna. With remote antennas located on top of towers, transportation of the large VNA proves especially difficult.

The SiteMaster manufactured by Wiltron Company of Morgan Hill, Calif., in contrast, is a single measurement port VNA having dimensions equal to or less than 8 inches by 6 inches by 2½ inches and a weight of less than three pounds, including batteries, when operating over a 25 MHz to 3.3 GHz frequency range. With such weight and size, the SiteMaster can be easily transported by one person to make test measurements at a remote sight. Components used in the currently manufactured SiteMaster are described in the cross-referenced handheld VNA application.

With one VNA measurement port, the SiteMaster can be utilized to discover the existence of a fault or discontinuity using frequency domain measurements, and locate the position of the fault using time domain measurements. The SiteMaster can also be used to extend a test port to the end of a cable, and to make measurements on an active device by distinguishing extraneous signals.

However, it would further be desirable to have a handheld VNA with two measurement ports enabling transmission measurements to be made. For instance in a cell site, a low noise amplifier (LNA) is utilized to provide a signal from a transmitter to an antenna. Although no faults may be discovered when making a one port reflection measurement through the LNA, the LNA may not be properly amplifying a signal from the transmitter, a fact which cannot be easily discovered using a one port VNA. By transmitting a signal through the LNA from a first VNA measurement port, and receiving the transmitted signal from the LNA at a second VNA measurement port, one can determine whether the LNA is properly amplifying an input signal.

A two measurement port handheld VNA would also be desirable to measure antenna gain at a cell cite. As with the LNA, when making a one port reflection measurement through an antenna, no faults may be discovered, but the power delivered by the antenna may be below a desired level in a particular direction from the antenna. By transmitting a signal through the cell site antenna from a first VNA measurement port, and receiving the transmitted signal with another antenna at a second VNA measurement port, antenna gain in different directions from the antenna can be determined.

Even if a cell site is functioning properly, signals from another antenna may be interfering with signals transmitted from or received by the cell site. A cell site antenna is typically located in close proximity with a significant number of other antennas. For instance, a remote location at which a cellular telephone cell antenna is located may also be the location for transmitter antennas for pagers, PCS, and AM and FM radio stations. Measurements at a cell site are, thus, also typically made to determine if interfering signals are present utilizing a spectrum analyzer.

The SiteMaster currently manufactured by Wiltron is designed to reject signals from external sources when making measurements, so the currently manufactured SiteMaster cannot be used to measure the frequency and power level of signals from external devices. Further, a spectrum analyzer typically uses upconverting and downconverting signals to reject undesired images generated when mixing. Such upconverting and downconverting typically requires generating a signal with a frequency significantly higher than a desired test signal. Components to generate such a high frequency signal if combined with components of a handheld VNA would add an unacceptable amount of weight and size to the handheld VNA.

SUMMARY OF THE INVENTION

The present invention provides a two port handheld VNA enabling both reflection and transmission measurements to be made while maintaining a size of 8 inches by 6 inches by 2½ inches and a weight of less than three pounds, including batteries,, when a test signal from 25 MHz to 3.3 GHz is desired.

The present invention further includes components enabling measurements to be made to monitor the frequency and power level of external signals without adding significant additional weight.

To provide a handheld device, the present invention includes components described in the cross-referenced handheld VNA application including a tracking synthesizer which generates a LO signal without a direct connection to a reference oscillator. The tracking synthesizer receives a signal from the reference oscillator as reduced in frequency by a test signal synthesizer which provides an RF test signal. With a reference signal not being provided directly to the tracking synthesizer, overall circuit complexity is reduced, and resolution of the LO signal can be made independent from RF test signal resolution.

The RF signal from the test signal synthesizer is provided to a mixer along with the LO signal from the tracking synthesizer to form an incident IF signal. The RF signal is also provided through a first measurement port, and a return signal from the first measurement port coupled to a mixer along with the LO signal to form a reflected IF signal., Synchronous detectors are then utilized which receive the IF signals and produce both real and imaginary incident and reflected signals to an A/D converter.

To enable reduced measurement error in the presence of an external signal, a dither line control feedback is provided to the reference oscillator from the incident real signal output of the synchronous detector to sweep the frequency of the reference oscillator. With the frequency of the reference oscillator swept, only a small portion of the test signal frequency range will interfere with the external signal.

The present invention further includes a second test port to receive transmitted signals. The transmitted signal provided to the second port is provided to a mixer along with the LO signal from the tracking synthesizer to provide a transmitted IF signal. Additional synchronous detectors are then utilized to receive the transmitted IF signal and produce both real and imaginary transmitted signals to the A/D converter.

To enable a signal from the test signal synthesizer to be adequately detected when received at the second test port, since the RF signal received may be significantly attenuated, the transmitted IF signal is provided through a variable gain amplifier to the synchronous detectors. To control gain of the variable gain amplifier, the signal from the variable gain amplifier is provided through a peak detector to an input of the A/D converter. The A/D converter output is then utilized to adjust the gain of the variable gain amplifier to a desired level.

The present invention also functions as a frequency monitor utilizing the variable gain amplifier. To provide the frequency monitor, a switch is included to disconnect the dither line during the frequency monitoring process. To limit the overall weight and size of circuitry for the frequency monitor, instead of using upconverting and downconverting typically provided in a spectrum analyzer, the present invention includes a unique measuring scheme. In the measurement scheme, the frequency range to be monitored is divided into bins. For each bin, measurements are made of IF signals with the LO signal stepped in frequency until IF signals are detected for all RF signals which may be received over the frequency width of the bin. During each measurement, the gain of the variable gain amplifier is stepped until a signal is received above a desired voltage value from the peak detector and a power level is then determined. The maximum power level detected during measurements for a bin is then stored as the power level for the signals for each bin.

BRIEF DESCRIPTION OF THE DRAWINGS

Further details of the present invention are explained with the help of the attached drawings in which.

DETAILED DESCRIPTION

Figure 1:
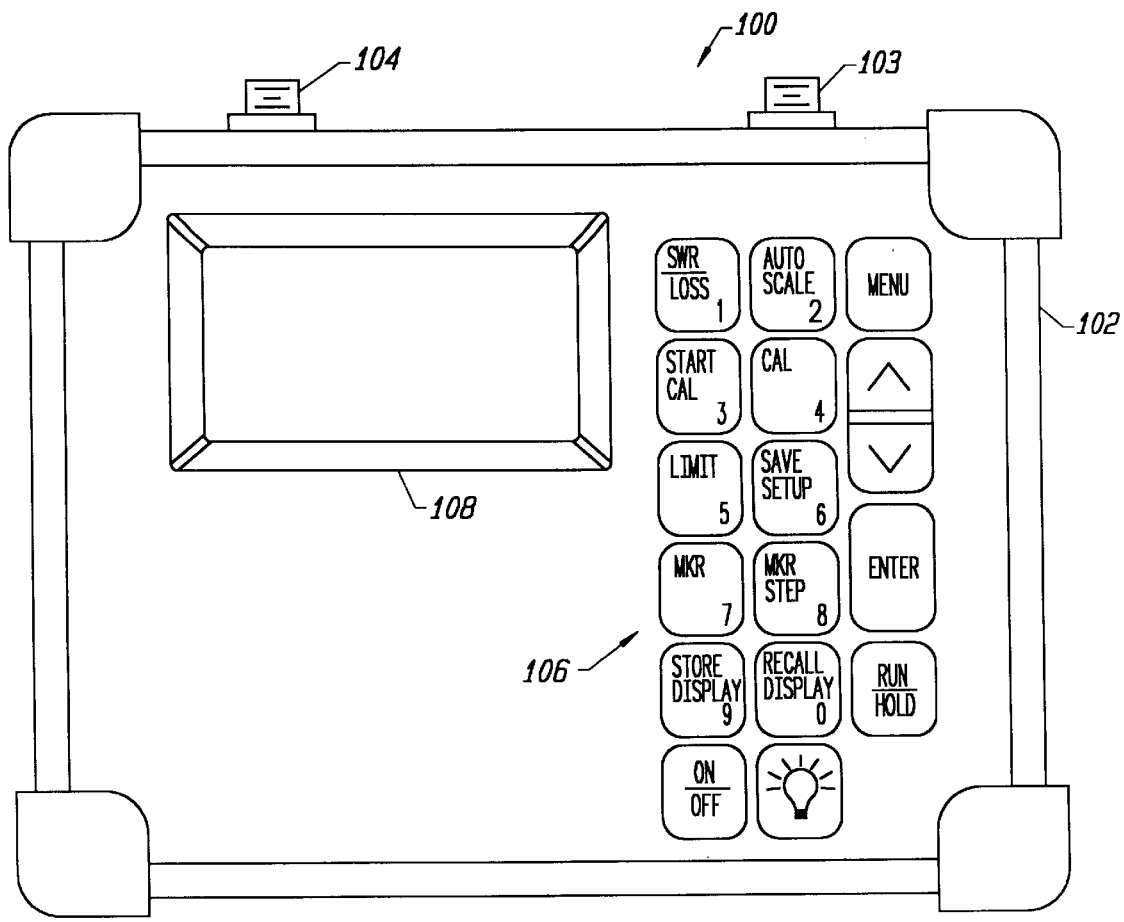
FIG. 1 shows the exterior of a handheld vector network analyzer of the present invention.

FIG. 1 shows the exterior of a two port handheld vector network analyzer (VNA) 100 of the present invention. The configuration of components in the VNA 100 of the present invention enables the size of the VNA housing 102 to have an approximate length of 6 inches, width of 8 inches and depth of 2½ inches when a test signal from 25 MHz to 3.3 GHz is desired. Further, components contained within the VNA enable the VNA to weigh less than 3 pounds, including weight of the batteries. With such small dimensions and low weight, the VNA 100 of the present invention is handheld and easily portable to a remote antenna sight to enable vector testing of a remote antenna and its associated microwave components as illustrated in FIG. 2.

As further shown in FIG. 1, the VNA 100 of the present invention includes two measurement test ports 103 and 104. Further, the housing 102 of the VNA 100 enables user access to a keypad 106 and display 108. The keypad 106 enables easy control for steps such as selecting a desired frequency range using the arrow keys, and calibration which can be performed by first pressing the START CAL button and then individually connecting a short, open, load and through and pressing the (CAL) button after each is connected. The keypad also enables control for measuring a standing wave ratio (SWR) and return or insertion loss (LOSS), return loss being measured during reflection measurements, and insertion loss being measured during transmission measurements (LOSS).

Figure 3:
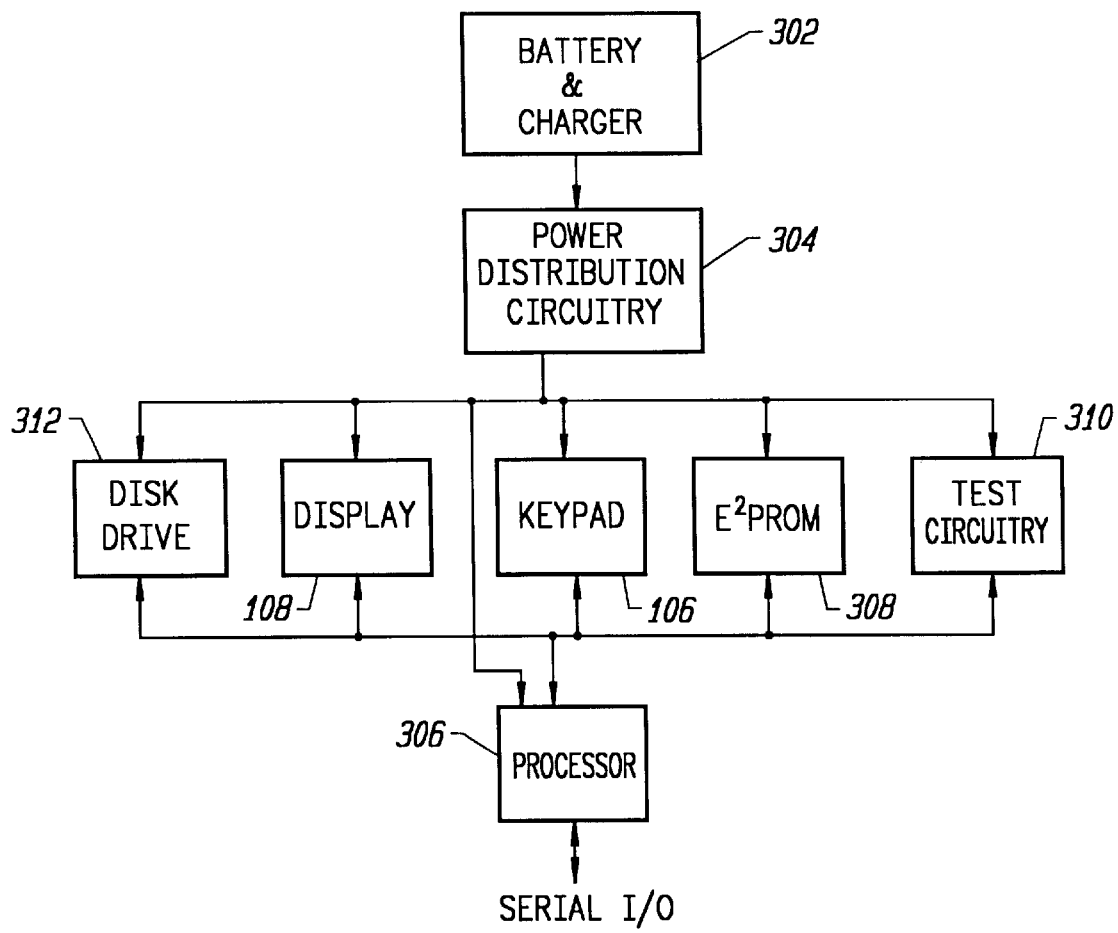
FIG. 3 shows a block diagram further illustrating components utilized in the VNA of the present invention.

FIG. 3 shows a block diagram further illustrating components utilized in the VNA of the present invention.

Figure 2:
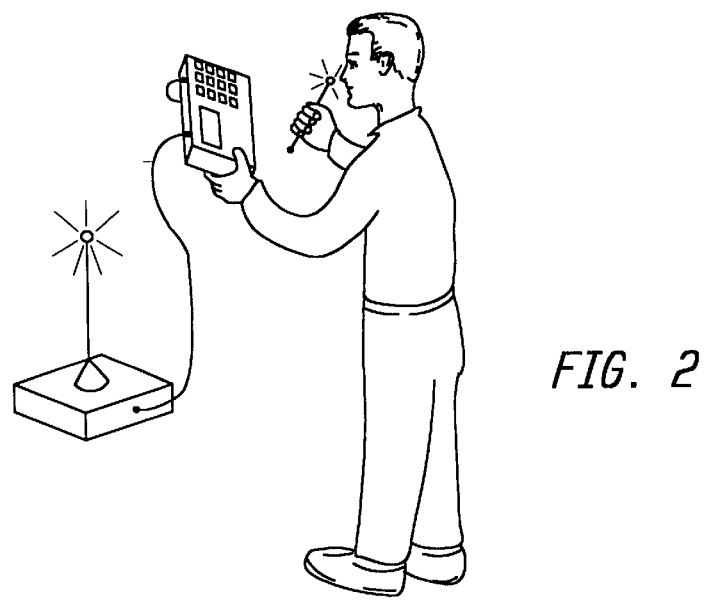
FIG. 2 illustrates how a VNA of the present invention is handheld and may be utilized at a remote antenna sight to enable vector testing of the antenna in the presence of signals being received by the remote antenna.

Because the VNA is designed for use at a remote location, as shown in FIG. 2, power is provided to the VNA by a battery 302 having an associated charger. Power distribution circuitry 304 provides power from the battery 302 to electrical circuitry of the VNA. Electrical circuitry to which power is distributed by power distribution circuitry 304, in addition to the keypad 106 and display 108 of FIG. 1, includes a processor 306, an EEPROM 308, test circuitry 310, and an optional disk drive 312.

The processor 306 utilized is an 8051 microcontroller which includes its own internal memory. The processor memory includes both a scratchpad memory as well as a programmable read only memory (PROM). The memory of the processor 306 is utilized to store control software as well as software containing a distance to fault calculation program and a vector error correction or calibration program. As shown connected to processor 306, the VNA also includes a serial I/O data port to enable communication to a personal computer for further data manipulation or archiving.

The EEPROM 308 is an electrically programmable and erasable PROM and provides additional memory to the internal memory of processor 306. The PROM is programmed to store test results, for example including as many as seven displays of information.

The optional disk drive 312 is a floppy disk drive enabling test measurements to be made at a remote sight and stored on a floppy disk. The floppy disk may then later be removed and easily transferred to a computer for further analysis of test data upon return from a remote test site. Without the floppy disk, the 2½ depth dimension discussed previously for the housing 102 of FIG. 1 can be reduced.

The test circuitry 310 includes components which generate, send and receive test signals and process the test signals to enable test measurements to be made. To keep size and weight of the VNA to a minimum, the test circuitry 310 utilizes a narrow swept frequency range covering the frequencies desired for testing, for example 0.025–3.3 GHz for cellular and PCS technology discussed in the background.

Figure 4:
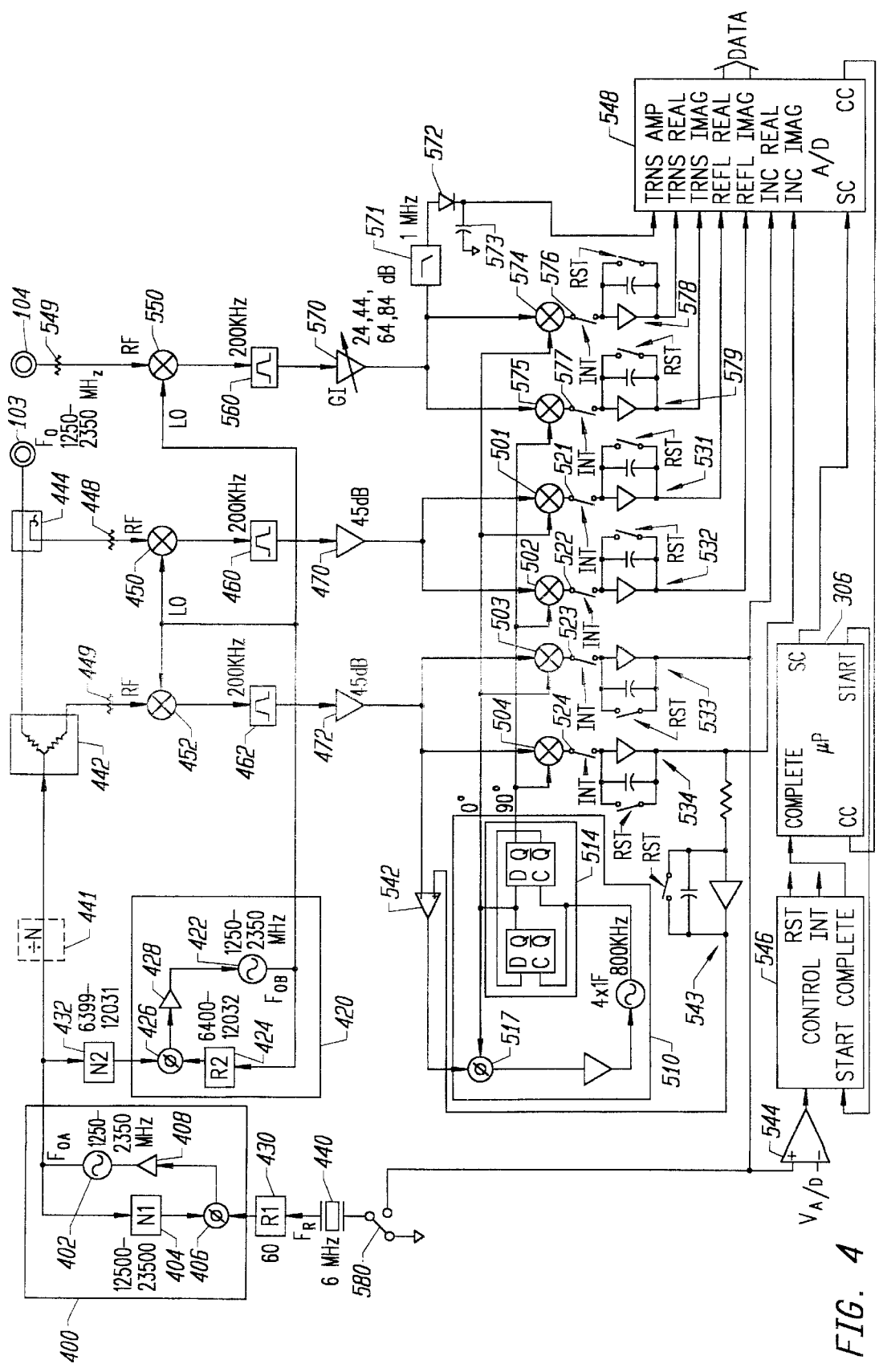
FIG. 4 shows components for the test circuitry shown in block diagram in FIG. 3 for the present invention.

FIG. 4 shows components for the test circuitry 310 shown in block diagram in FIG. 3 for the present invention. The test ports 103 and 104 and processor referenced in FIGS. 1 and 3 are similarly labeled in FIG. 4. Further in FIG. 4, representative values for frequencies for oscillators, gains for amplifiers, and frequency division numbers for frequency dividers are shown for purposes of illustration, although other values may be used depending on desired operating conditions.

The test circuitry of FIG. 4 initially includes two down-converters in the form of phase locked loops (PLLs), or synthesizer, including a test signal synthesizer 400 and a tracking signal synthesizer 420. Each of frequency synthesizers 400 and 420 include respective oscillators 402 and 422 and phase detectors 406 and 426. A first input of each of phase detectors 406 and 426 is connected to a reference signal. The first input of phase detector 406 is coupled to receive a reference signal from a reference signal oscillator 440, while the phase detector 426 is coupled to receive a reference signal from the output of oscillator 402. A second input of each of phase detectors 406 and 426 is connected through a respective frequency divider 404 and 424 to the output of its respective oscillator 402 and 422 to divide the frequency of its oscillator output by a respective number N1 and R2 set to provide an output matching the frequency of the first input of its phase detector. Outputs of each of phase detectors 406 and. 426 are provided through a respective amplifier and low pass filter 408 and 428 to the voltage control input of its respective oscillator 402 and 422.

The input to the test signal synthesizer 400 is coupled to the phase detector 406 of the reference oscillator 420 through a frequency divider 432. The test signal synthesizer 400, reference oscillator 440 and frequency divider 432 form a "variable R" frequency divider where R refers to the number R1 which the frequency divider divides the signal from reference oscillator 440.

The value for the RF output $F_{OA}$ from the oscillator 402 is $F_{OA}=F_R N1/R1$. Resolution, or the steps between frequencies which can be provided for the RF signal $F_{OA}$ can be defined as follows:

$$RES = F_R(N1-1)/(R1-1) - F_R N1/R1$$

$$= F_R(N1-R1)/(R1(R-1))$$

Wherein $F_R$ is the frequency from the reference signal oscillator 440. Settling time for the signal $F_{OA}$ is further defined as $t_{settle}=4.5/(2\eta F_R/10R1)$.

The values for R1 and N1 are chosen to optimize resolution and settling time for a particular frequency as described in detail in copending U.S. patent application Ser. No. 08/719,763 entitled "Frequency Synthesizer Using A Ratio Sum Topology, filed Sep. 25, 1996, and incorporated herein by reference.

A frequency divider 432 further is used to connect the output of the test signal synthesizer 400 to the tracking signal synthesizer. The frequency divider 432 divides the frequency output from the oscillator 402 by a value N2.

Referencing the tracking synthesizer 400 to the tracking signal synthesizer 420 utilizing the frequency divider 432, rather than referencing the tracking signal synthesizer 420 directly to the reference oscillator 440 reduces the complexity of circuitry needed to provide a LO signal and enables resolution of the LO signal to be controlled independent of the RF signal.

Further, by providing a connection between the test signal synthesizer 400 and tracking signal synthesizer 420 using the divide by N2 frequency divider 432, a multiple variable R synthesizer is created. By iteratively selecting N1, N2, R1 and R2, as further indicated the U.S. patent application Ser. No. 08/719,763 referred to above, output signal resolution and settling time for the LO signal $F_{OB}$ provided from oscillator 422 in the test signal synthesizer 302 can be minimized. The values of N1, N2, R1 and R2 are controlled by a signal provided by microprocessor 306.

To provide incident and reflected test signals, the signal $F_{OA}$ from the oscillator 402 of the test signal synthesizer is provided to the input of a splitter 442. To increase the frequency range of a signal provided to the splitter 442, and ultimately the test signal Fo provided from the VNA, the output from oscillator 402 can be provided to splitter 442 through an additional frequency divider 441 shown in dashed lines, or through a harmonic generator (not shown) as described in the cross-referenced handheld VNA application.

Power splitter 442 splits the signal from frequency divider 410 into two components. A first component provided from a first output of the splitter 442 is provided through coupler 444 to form the test signal $F_o$ provided to a device connected to the first test port 103 for testing. A reflected RF signal from the device under test is then received by coupler 444 and directed through a pad 448 to a first input of mixer 450. The attenuation values for pads 448 and 449 are chosen to equalize the amplitude of the incident and reflected signals.

A second output of the splitter 442 is provided as the incident RF signal through a pad 449 to a first input of mixer 452.

Second inputs of mixers 450 and 452 receive the LO signal from the output $F_{OB}$ of tracking signal synthesizer 420. By mixing the incident and reflected RF signals originating from splitter 442 in mixers 452 and 450 with the LO signal from frequency divider 430, the mixers 450 and 452 provide reflected and incident IF test signals at their outputs. If the frequency divider 441 is utilized, note that the output $F_{OB}$ would need to be provided through a similar frequency divider to mixers 450 and 452, or mixers 450 and 452 substituted with harmonic synthesizers.

The outputs of mixers 450 and 452 are connected to respective bandpass filters 460 and 462 to remove extraneous signals from the incident and reflected IF signals. The outputs of the bandpass filters 460 and 462 are then provided through respective amplifiers 470 and 472 to the inputs of synchronous detectors.

In the synchronous detectors of the present invention, the reflected IF output of bandpass filter 470 is received at a first input of multipliers 501 and 502, while the incident IF output of bandpass filter 472 is received at the first input of multipliers 503 and 504. A second input of multipliers 501 and 503 is connected to an output of a PLL 510 which provides a reference signal at the IF frequency phase shifted by 0 degrees. Multiplier 501, thus, outputs the reflected real component of the test signal while multiplier 503 outputs the incident real component of the test signal. A second input to multipliers 502 and 504 is connected to another output of PLL 510 which provides a reference signal at the IF frequency phase shifted by 90 degrees. Multiplier 502, thus, outputs the reflected imaginary component of the test signal while multiplier 504 outputs the incident imaginary real component of the test signal.

The outputs of multipliers 501–504 are connected through respective switches 521–524 and integrators 531–534 to A/D converter 548. The switches 521–524 are controlled to be opened or closed by an integrate signal (INT) received from control circuit 546. Further, control circuitry 546 provides a reset signal (RST) to a switch connected in parallel with the capacitors of integrators 531–534.

The PLL 510 includes an oscillator 912 operating at 4 times the IF frequency. The output of oscillator 512 is provided to a divide by four circuit 514 which provides a signal at the IF frequency with a phase shift of both 0 and 90 degrees.

The 0 degree output of frequency divider 514 is provided to one input of phase detector 517, while a second input at the IF frequency is provided from comparator 542. Comparator 542 has a positive input connected to the output of bandpass filter 472 and a negative input connected through an integrator (or amplifier) 543 to the output of integrator 534 to assure the incident imaginary signal is held to a value of 0V.

The comparator 542 holds the incident imaginary signal to 0 volts when measurements are taken because with any difference in phase between the signal from bandpass filter 472 and the 90 degree output of PLL 910, the output of integrator 534 will increase in voltage. With an offset in the voltage from integrator 534, integrator 543 amplifies the voltage to comparator 542 which will function to provide an output with a compensating phase shift to return the output of integrator 534 to zero volts.

To assure the full operation range of A/D converter 548 is utilized, the output of integrator 533 is provided to a positive input of a comparator 544. The negative input of comparator 544 is connected to a voltage reference supplying the maximum voltage of the A/D converter, $V_{A/D}$. The output of comparator 544 is supplied to control circuitry 546 which provides the RST, INT and a complete signal (COMPLETE). The COMPLETE signal is provided to a processor 306 along with a complete conversion (CC) from A/D converter 548. The processor provides a start signal (START) to control circuit 546 and a start conversion (SC) signal to the A/D converter 548.

Figure 5:
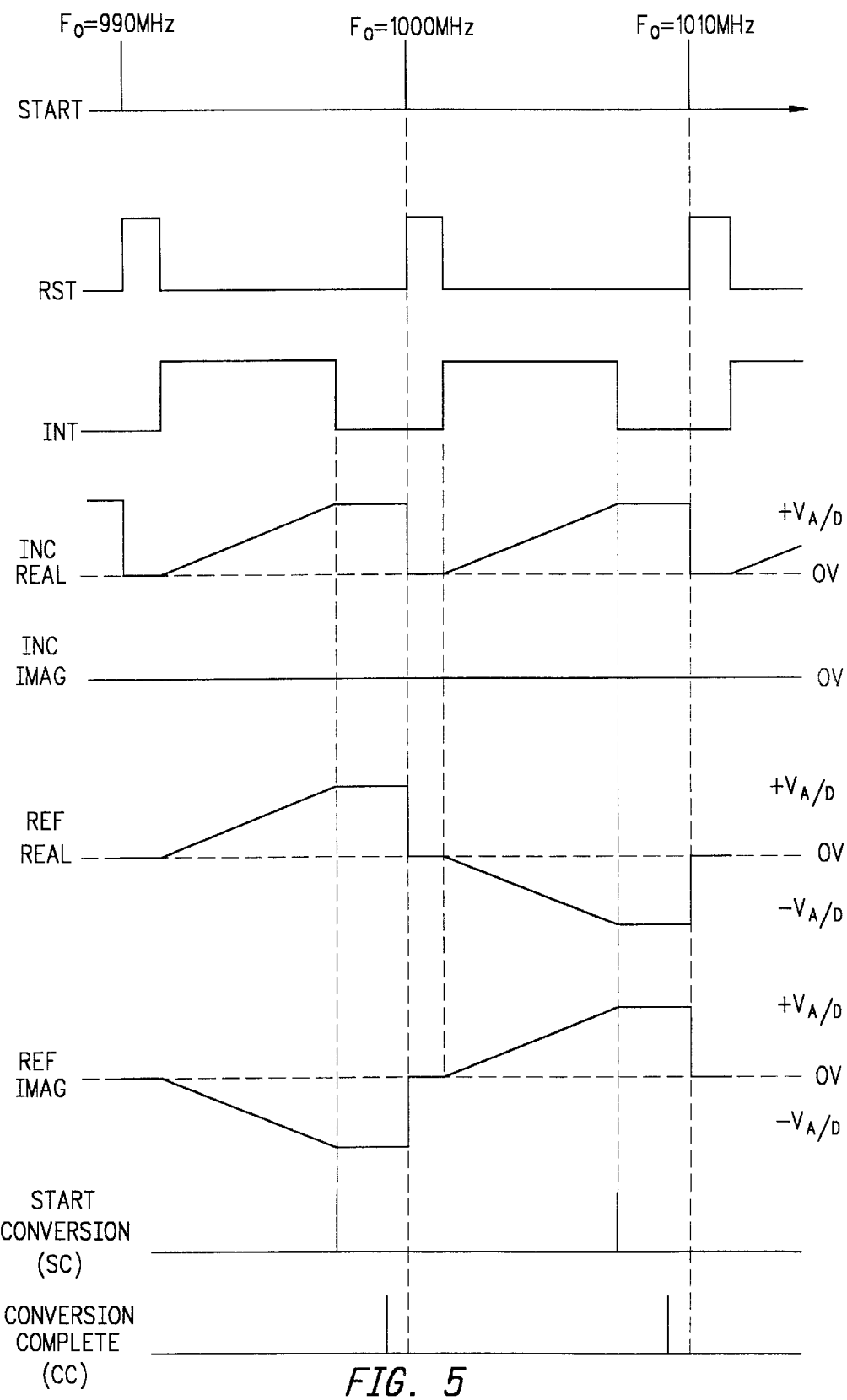
FIG. 5 shows signals received and produced by the A/D converter, control circuit, and microprocessor of FIG. 4.

Operation of the A/D converter 548 is described with reference to the signals shown in FIG. 5. FIG. 5 shows three START signals generated from processor 306 for measurements with the $F_o$ signal generated at 990, 1000, and 1010 MHz. Upon receipt of each start signal, control circuit 546 generates a reset signal (RST) to discharge the capacitors of integrators 531–534 so the output of the integrators will have an initial value of 0V. Further, on the trailing edge of each RST pulse, a integrate pulse (INT) is generated by control circuit 546, the INT signal closing switches 521–524 so that integrators 531–534 begin to function.

With the output of integrator 534 being provided to comparator 542 as described previously, the incident imaginary signal (INC IMAG) signal input to the A/D converter 548 is at 0V. With INC IMAG set to 0V, the incident real (INC REAL) signal will obtain its maximum value and will rise toward the maximum voltage $V_{A/D}$ of the A/D converter 548. Once $V_{A/D}$ is reached, comparator 544 provides a signal to control circuit 546 to turn off the INT signal, thus holding the outputs of integrators 531–534 at their current value. Further, the complete signal is sent to the microprocessor 306 which sends the start conversion signal (SC) to the A/D converter. Upon completion of conversion of its inputs to a digital data signal (DATA), the A/D converter 548 returns a conversion complete (CC) signal causing the processor to send the START signal back to control circuit 546 so that the next RST signal can be generated and another measurement cycle initiated.

The circuitry of FIG. 4 additionally includes a dither line coupling the output of integrator 533 to a voltage control input of a reference oscillator 440 to enable operation of the VNA with minimal interference from external signals. Reference oscillator 440 operates at a frequency $F_R$ which is a chosen reference frequency ± a 100 parts per million (ppm) offset. For example, if the desired reference frequency is 6 MHz, the ±100 ppm offset would be ±600 Hz. With the dither line connected to the output of integrator 533, the reference oscillator 440 will sweep the entire 100 ppm range during each measurement made by the A/D converter 548 due to the INC REAL signal always going from the 0V reference to +$V_{A/D}$. Note that although a ±100 ppm range is suggested, different ranges may also be used.

Figure 6:
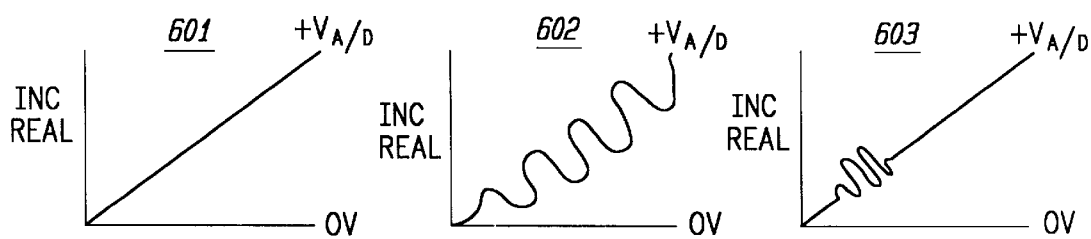
FIG. 6 illustrates operation of the circuitry of FIG. 4 with and without the dither line connected.

FIG. 6 illustrates operation of the test circuitry of FIG. 4 with and without the dither line connected. Graph 601 shows the INC REAL signal received without receipt of an additional external signal. Graph 602 shows the INC REAL signal received in the presence of an external signal of frequency substantially equal to the reference frequency $F_R$ with the dither line disconnected. In graph 602, interference of the signals occurs with error possibly occurring in the A/D measurement. Graph 603 shows the INC REAL signal in the presence of the interfering signal with the dither line connected. As shown, with the dither line sweeping the frequency of reference oscillator 440, interference occurs only in a small range, substantially reducing the possibility of error.

The present invention further includes the second test port 104 to receive transmitted signals. A signal received at test port 104 may be the signal $F_{OA}$ from the test signal synthesizer 400 as transmitted from the first test port 103, or a signal from another source. The signal received at the second test port 104 is provided through a pad 549 to the first input of mixer 550. The attenuation of pad 549 is set to equalize attenuation seen by a signal $F_{OA}$ when that signal is provided as an incident signal through pad 449, as a reflected signal through pad 448, or as a transmitted signal through pad 549, assuming no attenuation occurs between ports 103 and 104.

A second input of mixer 550 receives the LO signal from the output $F_{OB}$ of tracking signal synthesizer 420. By mixing a transmitted RF signal with the LO signal, a transmitted IF test signal is provided at the output of mixer 550. Although the device 550 is shown as a mixer, harmonic samplers may also be substituted as indicated previously.

Similar to the incident and reflected IF signals provided from mixers 452 and 460, the transmitted IF signal from mixer 550 is provided through a bandpass filter 560 and amplifier 570 to synchronous detectors. The bandpass filter has a bandwidth set to remove extraneous signals from the transmitted IF signals.

The amplifier 570 is a variable gain device with a gain controlled by processor 306. The variable gain amplifier 570 is utilized because the signal $F_o$ provided from port 103 may be significantly attenuated before reaching port 104, depending on components utilized to interconnect ports 103 and 104.

To determine the amount of gain G1 needed for amplifier 570, a peak detector made up of diode 572 and capacitor 573 couple the output of amplifier 570 to an input (TRNS AMP) of the A/D converter 548. An output of the A/D converter 548 is received by processor 306, and the processor 306 functions to increase the gain G1 of amplifier 570 when a signal is received in steps until a signal of a desired level is received from the peak detector 572, 573. A filter 571 is utilized to couple amplifier 570 to peak detector 572, 573 to remove undesired signals not removed by filter 560.

In the synchronous detectors, the transmitted IF output from amplifier 570 is received at a first input of multipliers 574 and 575. A second input of multiplier 574 is connected to an output of PLL 510 which provides a reference signal at the IF frequency phase shifted by 0 degrees. A second input of multiplier 575 receives an output of PLL 510 which provides a reference signal a the IF frequency phase shifted by 90 degrees. Multiplier 574, thus, outputs the transmitted real component of the transmitted signal, while multiplier 575 outputs the transmitted imaginary component of the transmitted signal.

The outputs of multipliers 574–575 are connected through respective switches 576–577 and integrators 578–579 to A/D converter 548. The switches 575–576 are controlled to be opened or closed by the integrate signal (INT) received from control circuit 546, the INT signal also being provided to switches 521–524 as described above. Further, control circuitry 546 provides a reset signal (RST) to a switch connected in parallel with the capacitors of integrators 578–579, the RST signal also being provided to switches 531–534 as described above. The A/D converter 548, upon receiving analog signals from integrators 578 and 579 as respective transmitted real (TRNS REAL) and transmitted imaginary (TRNS IMAG) signals provides a digital value for the analog values received.

The dither line connecting the output of integrator 533 to reference oscillator 440 sweeps the frequency of reference oscillator 440 to enable operation of the circuitry of FIG. 4 in the presence of external signals, as discussed above. With the LO signal provided to mixer 550 when the dither line is connected, signals received at port 104, other than signals provided from port 103 will be substantially removed.

So that the circuit of FIG. 4 can operate as a frequency monitor to detect the frequency and power level of external signals, a switch is included to connect or disconnect the dither line from reference oscillator 440 as controlled by processor 306. Further, instead of upconverting and downconverting typically performed in a spectrum analyzer to eliminate undesired image frequencies, the present invention utilizes the circuitry of FIG. 4 along with a unique measuring scheme to detect frequency and power for external signals.

The unique measurement scheme of the present invention enables detection of signals along with a determination of the maximum power level of signals within bins defined over a range of frequencies to be monitored. With the circuitry of FIG. 4, the frequency width of the bins will be greater than the typical fine resolution provided by a spectrum analyzer, and images will not be eliminated. However, size and weight will be reduced from circuitry typically found in a spectrum analyzer, and images created and measured can be identified as a possible source of interference when a frequency monitor of the present invention is utilized for detecting interfering at a cell site.

For the frequency monitor measurement scheme, the dither line is disconnected, and a frequency range to be monitored is divided into the bins, as indicated above. A first measurement of IF signals from amplifier 560 is then made with the LO signal set to a frequency value in the bin. The LO signal is then stepped in frequency so that the range of RF signals received at port 104 in the frequency range of the bin can produce IF signals from amplifier 560.

During each measurement for a bin, the gain of the variable gain amplifier 570 G1 is stepped until a desired voltage value is received from the peak detector 572, 573. The gain G1 of the amplifier 570 along with the additional voltage value from peak detector 572, 573 above the desired voltage value is stored and associated with a power level for each measurement for the bin. The maximum power level received during the measurements for the bin is then stored as the power level for signals detected for the bin. The measurement scheme is then applied to subsequent bins until power level measurements for each bin covering the entire frequency range to be monitored have been made.

Figure 7:
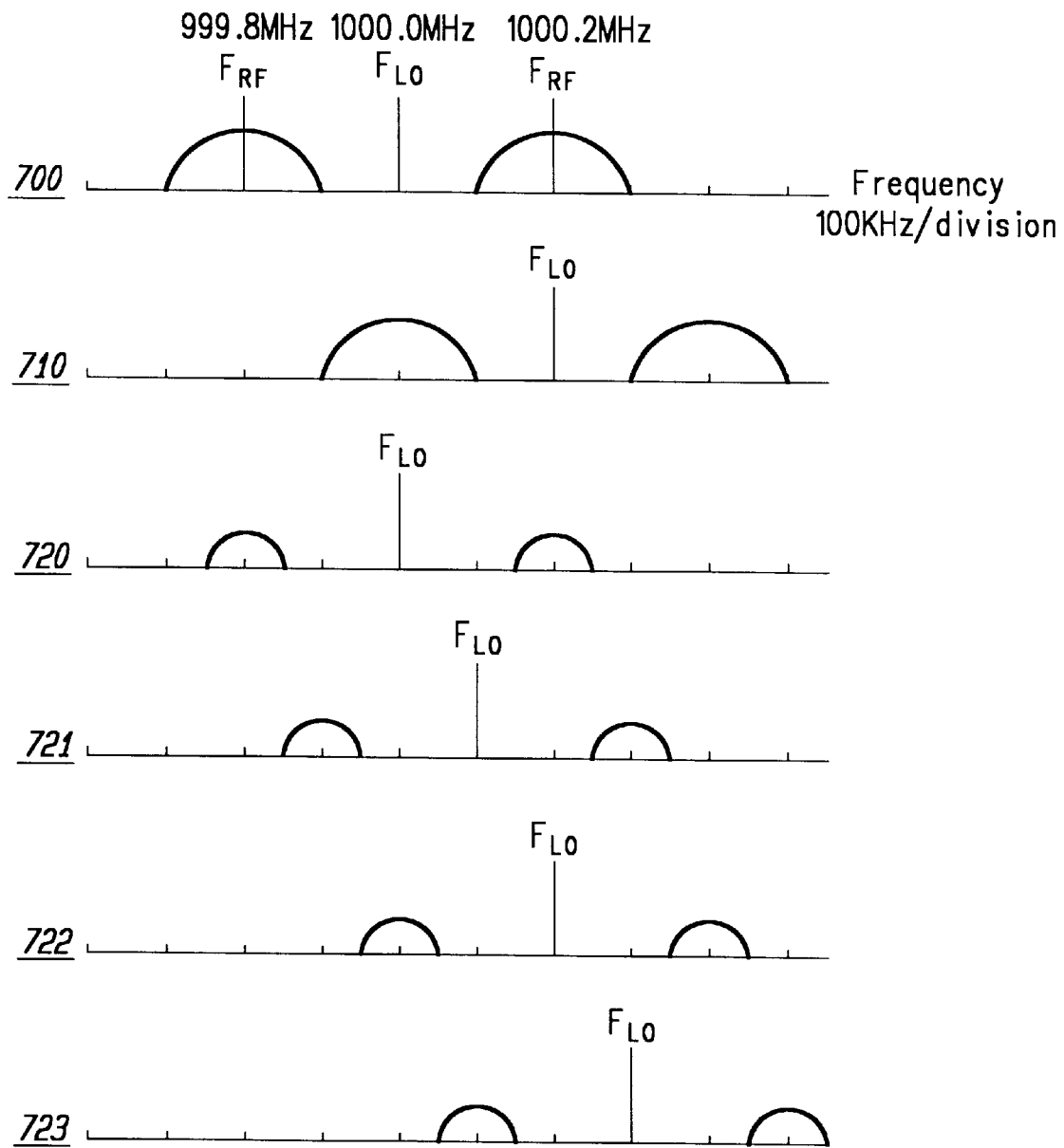
FIG. 7 illustrates the frequency monitoring measurement scheme for the present invention.

The frequency monitoring measurement scheme of the present invention is further described with reference to FIG. 7. FIG. 7 includes a first line 700 representing a range of frequencies with 100 KHz per division. For purposes of illustration, it is first assumed a LO signal $F_{LO}$ is provided as indicated on the line at 1000.0 MHz, and that RF external signals $F_{RF}$ occur at 1000.2 MHz and 999.8 MHz, also as shown. With such signals provided to mixer 550 of FIG. 4, an IF signal will be generated at 200 KHz for both RF signals. With a bandpass filter such as 560 having a center frequency at 200 KHz, and a bandwidth of 200 KHz, RF signals within the range of the semicircles shown from 1000.1–1000.3 MHz and 999.7–999.9 MHz would be detected from IF signals from amplifier 570 when mixed with the LO signal at 1000.0 MHz.

With a filter 560 having a 200 KHz center frequency and 200 KHz bandwidth, RF signals within the range 999.9–1000.1 MHz would not be detected. Stepping of the LO frequency to assure that RF signals in the 999.7–1000.3 MHz range will be detected is thus further performed using the scheme of the present invention as described with reference to line 710 of FIG. 7.

Line 710 represents a range of frequencies with 100 KHz per division, and also shows the LO signal stepped up in frequency to 1000.2 MHz. With bandpass filter 560 having a center frequency at 200 KHz, and a bandwidth of 200 KHz, RF signals within the range of the semicircle from 999.8–1000.1 will be detected from IF signals from amplifier 570, effectively filling in the frequency range gap shown on line 700 between the semicircles where RF signals were not previously detected. Additionally, as shown on line 710 with the LO signal at 1000.2 MHz, RF signals will be received within the semicircle shown from 1000.3–1000.5 MHz.

With a bin defined from 999.7–1000.5 MHz, and with the IF filter 560 having a center frequency of 200 KHz and a bandwidth of 200 KHz, two LO signals at 1000.0 MHz and 1000.2 MHz can, thus, be utilized to enable RF signals within the 800 KHz frequency range of the bin to be detected.

To illustrate the effect of reducing the bandwidth of filter 560 on the measurement scheme of the present invention, additional lines 720–723 are included in FIG. 7 showing frequency divisions of 100 KHz, similar to lines 700 and 710. For purposes of illustration, the bandwidth of filter 560 is assumed reduced to 100 KHz, while its center frequency is assumed ro remain at 200 KHz.

In line 700, with a LO frequency of 1000.0 MHz first utilized and the bandwidth of filter 560 reduced as indicated, RF signals will be detected in the range of 999.75–999.85 MHz and in the range of 1000.15–1000.25 MHz as shown by the semicircles. RF signals in the frequency range 999.85–1000.15 will, however, not be detected. By stepping the LO frequency in three 100 KHz steps using the measurement scheme of the present invention, as shown in lines 701–703, the 999.85–1000.15 range will be covered. In fact, RF signals through an entire frequency range from 999.75–1000.55 MHz can be detected, enabling a bin to be defined over that 800 KHz range.

Note that for the signals of FIG. 7, even though the bandwidth of filter 560 is reduced, the measurement range, or bin width, covered by stepping the LO to assure no RF signals with the bin go undetected, remains at four times the IF center frequency of filter 560, or at 800 KHz. Thus, to keep costs at a minimum, higher bandwidth filters may be selected for element 560 with out affecting resolution.

Although the invention has been described above with particularity, this was merely to teach one of ordinary skill in the art how to make and use the invention. Many modifications will fall within the scope of the invention, as that scope is defined by the following claims.

What is claimed is:

1. A method of monitoring the frequency and power level of RF signals occurring within a test frequency range comprising the steps of:

defining bins, each bin having a frequency range occupying a portion of the test frequency range, and for each bin:
   (a) setting a local oscillator (LO) to an initial frequency value;
   (b) mixing the LO frequency with the RF signals to provide IF signals;
   (c) filtering the IF signals to create received IF signals generated from a portion of the RF signals occupying a portion of the frequency range of the respective bin;
   (d) measuring the peak power level of the received IF signals and storing the measured power level value;
   (e) determining if measurements have been made at all of a predetermined number of frequency steps of the LO for the respective bin, wherein the predetermined number is greater than one;
   (f) resetting the LO frequency when the determining step indicates that measurements have not been made at all desired frequency steps of the LO and proceeding to step (b), and otherwise proceeding to step (g); and
   (g) storing a maximum measured power level value measured in step (d) as the power level value for the respective bin.

2. The method of claim 1, wherein in the step of measuring a peak power level of the received IF signals, gain of an amplifier providing the received IF signals is increased until a voltage level of the IF signals exceeds a desired voltage, and wherein the gain of the amplifier along with a voltage level of the received IF signal above the desired voltage is used to determine the measured peak power level.

3. A method of determining gain settings for an amplifier providing IF signals downconverted from RF signals within a test frequency range comprising the steps of:

defining bins, each bin having a frequency range occupying a portion of the test frequency range, and for each bin:
   (a) setting a local oscillator (LO) to an initial frequency value;
   (b) mixing the LO frequency with the RF signals to provide IF signals;
   (c) filtering the IF signals to create received IF signals generated from a portion of the RF signals occupying a portion of the frequency range of the respective bin;
   (d) increasing gain of the amplifier until a desired voltage is obtained for the received IF signals and storing a value for the gain;
   (e) determining if measurements have been made at all of a predetermined number of frequency steps of the LO for the respective bin, wherein the predetermined number is greater than one;
   (f) resetting the LO frequency when the determining step indicates that measurements have not been made at all desired frequency steps of the LO and proceeding to step (b), and otherwise proceeding to step (g); and
   (g) storing a maximum measured gain value obtained in step (d) as the power level value for the respective bin.

4. A method of determining gain settings of for an amplifier providing IF signals downconverted from RF signals within a test frequency range comprising the steps of:

defining bins, each bin having a frequency range occupying a portion of the test frequency range, and for each bin:
   downconverting the RF signals to provide IF signals;
   filtering the IF signals to create received IF signals generated from a portion of the RF signals occupying a portion of the frequency range of the respective bin; and
   increasing gain of the amplifier until a desired voltage is obtained for the received IF signals and storing a value for the gain obtained as a gain setting for the respective bin.

* * * * *